(12) United States Patent
Ponghon

(10) Patent No.: US 10,782,341 B2
(45) Date of Patent: Sep. 22, 2020

(54) SEMICONDUCTOR DEVICE HANDLER WITH A FLOATING CLAMP

(71) Applicant: Texas Instruments Incorporated, Dallas, TX (US)

(72) Inventor: Mhark Lester Lauron Ponghon, Tarlac (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/371,201

(22) Filed: Apr. 1, 2019

(65) Prior Publication Data
US 2020/0064399 A1 Feb. 27, 2020

Related U.S. Application Data

(60) Provisional application No. 62/720,724, filed on Aug. 21, 2018.

(51) Int. Cl.
*G01R 31/28* (2006.01)
*H01L 21/687* (2006.01)

(52) U.S. Cl.
CPC ..... *G01R 31/2893* (2013.01); *G01R 31/2865* (2013.01); *G01R 31/2896* (2013.01); *H01L 21/687* (2013.01)

(58) Field of Classification Search
CPC ............ G01R 31/2893; G01R 31/2896; G01R 31/2865; H01L 21/687; H01L 21/6838; H01L 21/68707
See application file for complete search history.

(56) References Cited

U.S. PATENT DOCUMENTS

| | | | | |
|---|---|---|---|---|
| 4,103,718 A | * | 8/1978 | Steigerwald | H01L 21/4842 140/105 |
| 4,736,938 A | * | 4/1988 | Jiruse | B65H 3/0883 271/90 |
| 5,124,644 A | * | 6/1992 | Ganapol | G01R 31/2893 324/73.1 |
| 5,504,436 A | * | 4/1996 | Okutsu | G01R 1/0433 324/756.02 |
| 5,574,383 A | * | 11/1996 | Saito | G01R 1/0433 324/750.25 |
| 5,920,192 A | * | 7/1999 | Kiyokawa | G01R 31/01 324/750.2 |

(Continued)

*Primary Examiner* — G. M. A Hyder
(74) *Attorney, Agent, or Firm* — Rose Alyssa Keagy; Charles A. Brill; Frank D. Cimino

(57) ABSTRACT

A chuck apparatus includes a nozzle with a first end configured to engage a device under test (DUT), and a clamp extending around a portion of the nozzle proximate the first end. The clamp includes a recess to receive the DUT, and an engagement surface in the recess to engage the DUT. The chuck apparatus also includes a spring that biases a surface of the clamp toward the first end of the nozzle. A method includes translating a chuck to engage a nozzle with a DUT, further translating the chuck to engage and self-align an engagement surface of a spring mounted clamp with the DUT, further translating the chuck to seat the DUT in the spring mounted clamp, translating the chuck with the DUT to a contactor and translating the chuck with the DUT to engage conductive features of the DUT with conductive probes of the contactor.

20 Claims, 11 Drawing Sheets

(56) References Cited

U.S. PATENT DOCUMENTS

| | | | | |
|---|---|---|---|---|
| 6,462,534 | B2* | 10/2002 | Kang | G01R 1/0408 |
| | | | | 324/750.05 |
| 6,784,657 | B2* | 8/2004 | Fujishiro | G01R 31/2887 |
| | | | | 324/750.19 |
| 7,202,693 | B1* | 4/2007 | Kush | G01R 31/2893 |
| | | | | 324/750.11 |
| 7,650,687 | B2* | 1/2010 | Woo | H01L 21/67092 |
| | | | | 140/105 |
| 8,550,524 | B2* | 10/2013 | Yeh | B25B 11/007 |
| | | | | 294/183 |
| 2005/0156166 | A1* | 7/2005 | Adachi | H01L 21/6838 |
| | | | | 257/48 |
| 2006/0043990 | A1* | 3/2006 | Sato | G01R 31/2893 |
| | | | | 324/756.02 |
| 2007/0200555 | A1* | 8/2007 | Mizushima | G01R 31/2887 |
| | | | | 324/754.13 |
| 2012/0306526 | A1 | 12/2012 | Ponghon et al. | |
| 2018/0172760 | A1* | 6/2018 | Leikermoser | G01R 31/286 |

* cited by examiner

SEMICONDUCTOR DEVICE HANDLER WITH A FLOATING CLAMP

REFERENCE TO RELATED APPLICATION

Under 35 U.S.C. § 119, this application claims priority to, and the benefit of, U.S. provisional patent application No. 62/720,724, entitled "Punch QFN Compliant Corner Anvil Chuck", and filed on Aug. 21, 2018, the entirety of which is hereby incorporated by reference.

BACKGROUND

Surface mount electronic devices, such as integrated circuits (ICs) are packaged in a variety of different forms to facilitate soldering to a host printed circuit board (PCB) without using through holes. Quad flat no-lead (QFN) packages, dual flat no-lead (DFN) and small outline no-lead (SON) packages include one or more rows of exposed conductive features or lands, such as copper, formed from a lead frame, along with plastic, ceramic, or other housing material to provide an integrated structure. The conductive lands of the QFN, DFN and SON device bottom can be soldered to copper pads of the host PCB. Perimeter lands on the package bottom provide electrical connections to the PCB, and the lands can include exposed portions along the sides of the package. Certain packages also include a thermal pad on the top or bottom of the packaged device to facilitate heat transfer. Sawn QFN packages are molded in a single mold cavity or mold array process (MAP) and singulated by saw cutting during manufacturing. As a result, sawn QFN devices have generally vertical sidewalls. Punch QFN packages are molded in individual cavities and separated using a punch tool, and often include tapered side walls.

During manufacturing, the singulated devices are subjected to final testing using a test system with a chuck that brings individual devices to a test contactor. The package lands are probed by test contactor pins and electrical signals are applied to test the circuitry of the packaged device. The chuck includes a tip that pushes the device to the contactor. However, dimensional variations in the finished device package, even if within manufacturing tolerances, lead to difficulties controlling the height of the chuck tip when engaging the device with the contactor. The inherent fabrication and machine tolerances may allow damage to a given device. Moreover, overdriving the chuck positioner may damage the tested device, such as by allowing the device to be clamped by the contactor pins, or may lead to compression of the tip and shortening of the chuck height. Use of a compressed tip or reduced height chuck in a different set up results in insufficient chuck height to push the device to the contactor. In addition, non-anvil chucks require a plate to align the device before approaching the contactor. Compliant chucks have been developed for sawn QFN packages. However, the tapered side walls of punch QFN packages may allow the chuck anvil to contact and damage conductive lands at or near the bottom of the package, leading to mold heel cracking, bending and/or delamination.

SUMMARY

An example chuck apparatus includes a nozzle extending along an axis between a first end to engage a device under test (DUT), and a clamp extending around a portion of the nozzle near the first end. The clamp includes a recess to receive the DUT, and an engagement surface in the recess to engage the DUT. The chuck apparatus further includes a clamp spring that biases a surface of the clamp toward the first end of the nozzle.

An example method includes translating a chuck downward to engage a bottom nozzle end with a DUT, further translating the chuck downward to engage and self-align an engagement surface of a spring mounted clamp with a sidewall of the DUT, and further translating the chuck downward to seat the sidewall of the DUT in the spring mounted clamp. The method also includes translating the chuck with the DUT to a contactor and translating the chuck with the DUT downward to engage conductive features of the DUT with conductive probes of the contactor.

An example system includes a contactor with conductive probes to connect to a device under test (DUT), an electronic test circuit connected to the contactor, and a chuck apparatus. The chuck apparatus includes a nozzle extending along an axis with a first end configured to engage the DUT and a clamp extending around a portion of the nozzle proximate the first end. The clamp includes a recess to receive the DUT and an engagement surface in the recess to engage the DUT. The chuck apparatus also includes a clamp spring that biases a surface of the clamp toward the first end of the nozzle.

DETAILED DESCRIPTION

Figure 1:
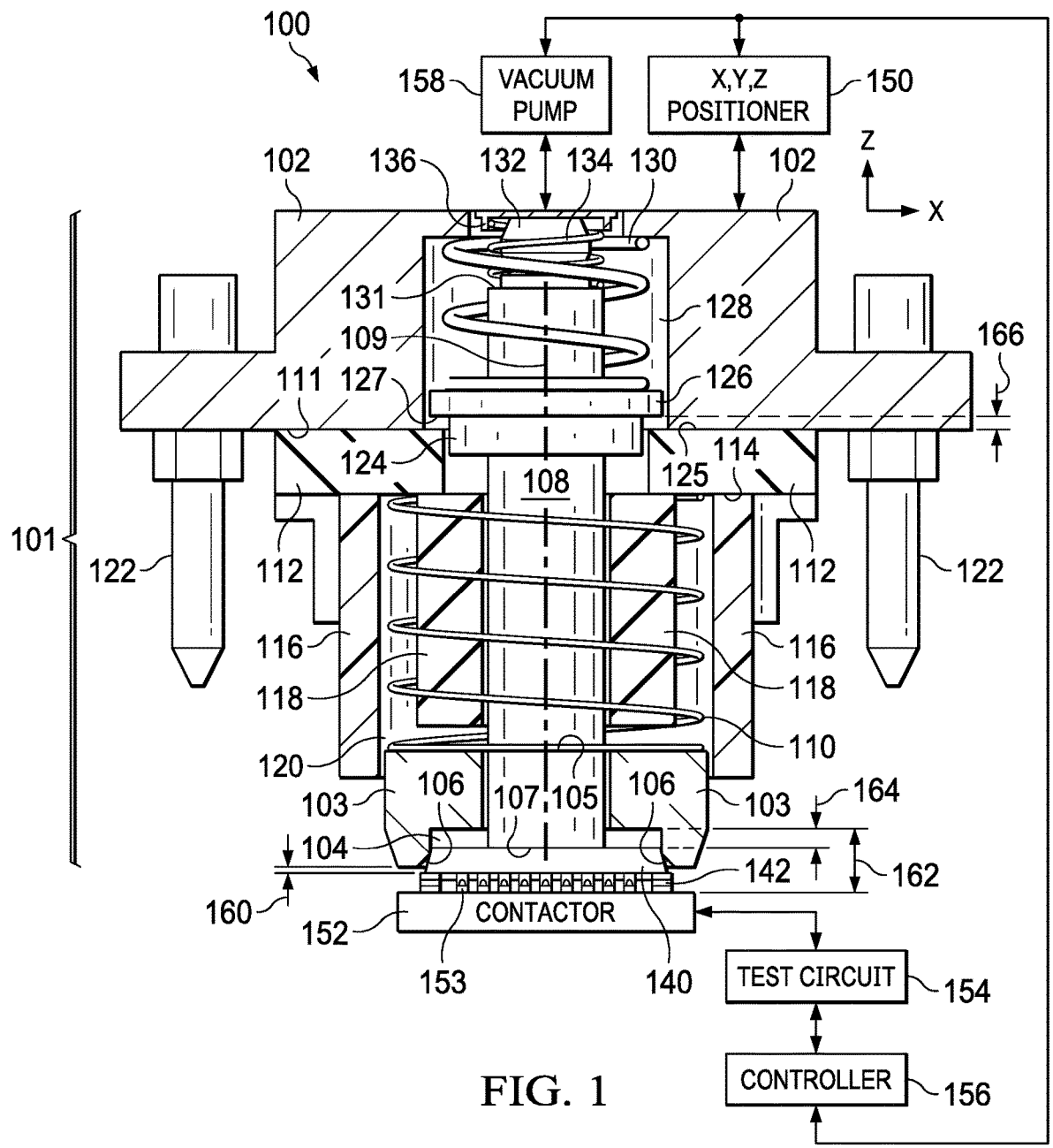
FIG. 1 is a partial sectional side elevation view of an electronic device test system with a chuck apparatus.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Final test systems and chuck apparatus examples are described, along with test methods to test a package electronic device. The illustrated examples can be used in connection with punch QFN devices, as well as with other packaged electronic device forms and types. Described examples provide a floating clamp, such as a device anvil structure, biased by a clamp spring with respect to a clamp nozzle. Disclosed examples allow a device under test (DUT) to self-align with an inner sidewall of the anvil. The floating clamp arrangement accommodates dimensional variations within accepted tolerance specifications without the DUT being damaged or becoming stuck or clamped on the wall of the clamp. The examples further prevent the clamp from touching conductive lands or other leadframe portions of the packaged device, even at minimum and maximum package tolerances. The clamp spring mitigates or avoids over and under compression of the DUT against contactor pins while facilitating proper compression for low contact resistance during testing. The spring biased floating clamp structure maintains device flatness and properly holds the device before and after testing. In use with punch QFN or other tapered device packages, the floating spring biased clamp provides compliant corners which can move up and down to accommodate package thickness variations in a given width dimension tolerance range (e.g., from 0.55 mm to 1.5 mm) while ensuring proper contactor pin compression. The described examples can be used without a device alignment plate, thereby mitigating or avoiding debris otherwise caused by the alignment plate scraping installed device packages.

Figure 2:
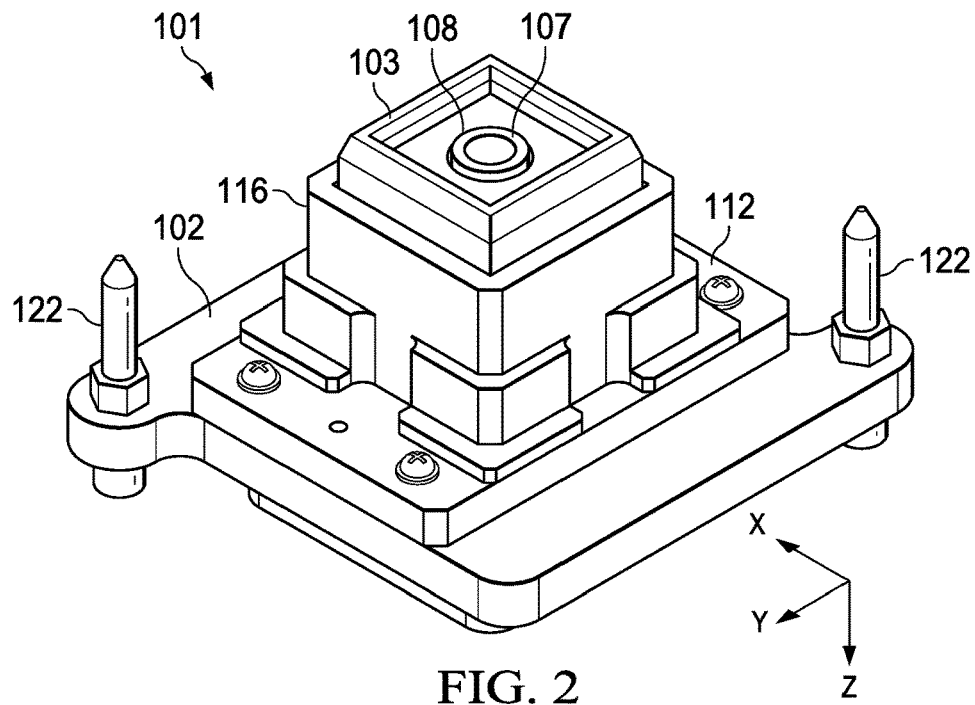
FIG. 2 is a bottom perspective view of the assembled chuck apparatus.
Figure 4:
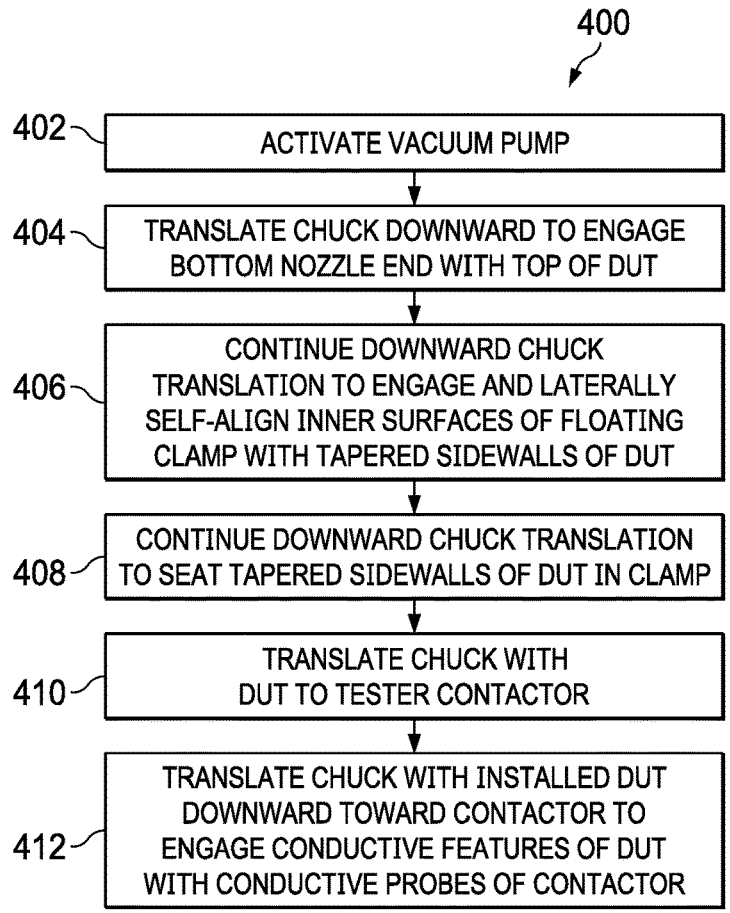
FIG. 4 is a flow diagram of an electronic device test method.
Figure 3:
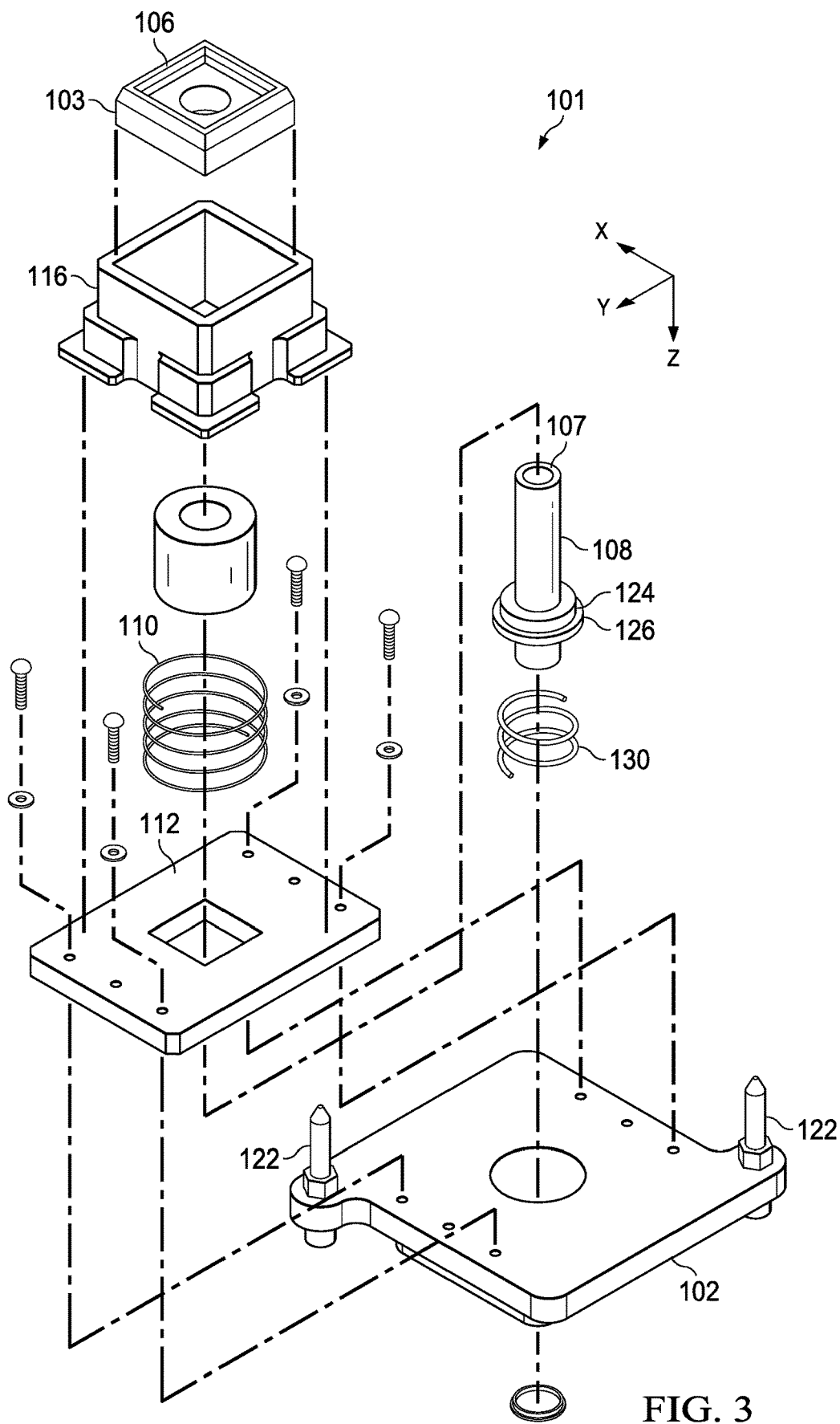
FIG. 3 is a bottom perspective view of the chuck apparatus partially disassembled.

Referring initially to FIGS. 1-3, FIG. 1 shows a system 100 with a chuck apparatus 101 for testing packaged electronic devices. FIG. 2 shows a perspective view of the assembled chuck apparatus, and FIG. 3 shows a perspective view of the chuck apparatus partially disassembled. The system 100 is illustrated and described in connection with testing of an example QFN device, although not a strict requirement of all possible implementations. In other examples, the described techniques and apparatus can be used in connection with DFN, SON or other flat no-lead electronic devices, as well as with different package types and forms. The described examples provide particular utility in association with punch QFN packaged devices having tapered side walls. In this regard, the example chuck apparatus 101 facilitates engagement, movement and testing of punch QFN devices (hereinafter referred to as devices under test or DUTs) in an automated process after device packaging in a fabrication process, with the chuck apparatus 101 operating in a repetitive sequence to pick up a DUT from a tray or carrier structure, transport the DUT to a test fixture with a contactor, engage the DUT with the contactor for automated device electrical tests, and return the tested DUT to the carrier structure. During testing, the example chuck apparatus 101 prevents or mitigates touching of conductive lands or other conductive features of the DUT by structures of the chuck apparatus 101.

The chuck apparatus 101 includes a base 102, such as steel or other metal in one example. The chuck apparatus 101 also includes a clamp 103 (e.g., an anvil) with a recess 104 and an upper surface 105. In one example, the clamp 103 is or includes stainless steel, although not a strict requirement of all possible implementations and other materials can be used. In one example, the outside shape of the clamp 103, and the shape of the recess 104 are similar to the shape of the device under test, such as a square shape for a punch QFN device. An elongated shape can be used in other implementations, for example, for a DFN package. The clamp 103 includes an engagement surface 106 in the recess 104 to engage a DUT. The clamp 103 in the example of FIGS. 1-3 includes outer walls surrounding the recess 104, with downward extending lobe structures. The inner sidewall of the recess 104 in this example extends around four sides of the generally square recess shape, and includes a generally vertical portion (e.g., parallel to the vertical Z direction in FIGS. 1-3) that extends downward from an upper surface of the recess 104, as well as a tapered lower portion that tapers outwardly. In this example, the tapered lower portion, and the edge between the vertical and tapered portions provides the engagement surface 106 to engage a tapered side wall of a punch QFN DUT in the recess 104. In another example, the inner sidewall of the recess can include a single tapered portion, or a single generally vertical portion, to provide an engagement surface to engage with a DUT.

The clamp 103 provides engagement and lateral self-alignment of a DUT with the chuck apparatus 101 without requiring an outlying alignment plate (not shown). In addition, the clamp 103 preferably does not touch laterally extending lands or other conductive features 142 of an installed DUT. An installed DUT also engages with a bottom (e.g., first) end 107 of a nozzle 108. In one example, the nozzle 108 is an elongated, generally cylindrical structure that extends along an axis 109 (e.g., along the Z direction in FIGS. 1-3), although different shapes and profiles can be used in other implementations. The example nozzle 108 is hollow, and includes an interior passage (not shown in FIG. 1) that extends along the axis 109 from the first end (107) to a second (e.g., upper) end. The nozzle interior allows application of a vacuum to engage a planar top side of a DUT with the planar surface of the first nozzle end 107 and hold the DUT engaged to the nozzle (108).

The chuck apparatus 101 also includes a clamp spring 110 that biases the upper clamp surface 105 downward along the axis 109 (e.g., in the −Z direction in FIGS. 1-3). The clamp 103 floats relative to the base 102 and floats relative to the nozzle 108. The clamp spring 110 is positioned between the base 102 and the upper surface 105 of the clamp 103. The clamp spring 110 biases the clamp 103 toward the first end 107 of the nozzle 108.

In the example of FIGS. 1-3, the first end of the clamp spring 110 is directly engaged to the clamp surface 105 and the second (e.g., upper) end of the clamp spring 110 is engaged indirectly to the lower surface 111 of the base 102 through a pad 112. In another example, the pad 112 can be omitted. An upper surface 125 of the pad 112 is mounted to the lower surface 111 of the base 102. In one example, the pad 112 is a flexible material, such as rubber, although not a strict requirement of all possible implementations and other materials can be used. The first end of the clamp spring 110 directly engages with (e.g., contacts) a lower (e.g., bottom) surface 114 of the pad 112, and the second end of the clamp spring 110 directly engages with (e.g., contacts) the upper surface 105 of the clamp 103 to bias the clamp 103 toward the first end 107 of the nozzle 108.

The chuck apparatus 101 in FIGS. 1-3 also includes a clamp guide 116 mounted to the bottom surface 114 of the pad 112. The clamp guide 116 extends downward and extends laterally around a portion of the clamp 103 to provide an outer limit to lateral movement of the clamp 103 (e.g., in the X direction in FIGS. 1-3 and/or in a lateral Y direction into the page in FIG. 1). In one example, the clamp guide 116 is or includes a plastic material, although not a strict requirement of all possible implementations. In one example, the inner side walls of the clamp guide 116 generally conform to the outer side walls of the clamp 103 to operate as a guide to prevent excessive lateral movement of the clamp 103 in the direction along the axis 109.

The chuck apparatus 101 of FIGS. 1-3 also includes a cylindrical spring guide 118 to guide the clamp spring 110 in a inner recess 120 between the interior of the clamp guide 116 and the outer sidewalls of the spring guide 118. In one example, the spring guide 118 is rubber or other flexible material, although not a strict requirement of all possible implementations and other materials can be used. The chuck apparatus 101 also includes downward facing cylindrical alignment structures 122 positioned at four corners of the lower surface 111 of the base 102. The clamp spring 110 in one example is a cylindrical configuration that extends in the recess 120 between the first end at the surface 114 of the pad 112 and the second end at the upper surface 105 of the clamp 103. The clamp spring 110 in one example is compressed when installed in the recess 120 during chuck assembly to bias the clamp 103 downward along the axis 109 in the example orientation of FIG. 1.

As further shown in FIGS. 1 and 3, the nozzle 108 includes a flange 124 that extends laterally outward from the remaining outer surface of the nozzle 108 to create a step with an abutment surface. A lower side or surface of the flange 124 is configured to engage or abut and upper side of the spring guide 118 to set the lower limit of the axial travel of the nozzle relative to the base 102. The chuck apparatus 101 also includes a plate 126 that extends around a portion of the nozzle 108 above the flange 124 in an opening 128 of the base 102. The plate 126 is floating with respect to the base 102, and includes a lower side or surface 127 biased toward the flange 124 by a plate spring 130. The plate spring 130 is positioned between an upper surface of the plate 126 and an upper surface of the opening 128 of the base 102. The plate spring 130 is compressed during installation to bias the plate 126 downward (along the −Z direction in FIGS. 1 and 3).

An upper second end 131 of the nozzle 108 is connected to a vacuum pump port 132, such as a flexible baffle that allows connection of the hollow nozzle interior with a pump to draw a vacuum for engaging the bottom (first) nozzle end 107 with a device under test. The upper end of the base 102 includes an opening for external access to the port 132. An upper support spring 134 extends along the direction of the axis 109 between the port 132 and a support member 136 positioned in the opening of the base 102. As illustrated and described further below, the nozzle 108 is movable along the axis 109 in a first range in which the flange 124 is spaced from the plate 126 and the plate 126 is in contact with an upper surface 125 of the pad 112 (e.g., FIGS. 5-7 below). In addition, the nozzle 108 is movable along the axis 109 in a second range in which the flange 124 is in contact with the plate 126 and the plate 126 is in contact with or spaced from the upper surface 125 of the pad 112 (e.g., FIGS. 8-12). In addition, the clamp 103 is movable relative to the base 102, the clamp guide 116 and the pad 112 along the direction of the axis 109, and is biased downward by the clamp spring 110.

FIG. 1 illustrates an example of the chuck apparatus 101 in the device final test system 100. A packaged punch QFN DUT 140 is engaged to the first end 107 of the nozzle 108 by a vacuum of the hollow nozzle. The DUT 140 includes conductive lands 142 along the bottom of the QFN package. The tapered side walls of the punch QFN DUT 140 are engaged by the engagement surface 106 of the clamp 103. The system 100 also includes a multi-axis chuck positioner apparatus or position control system 150 (e.g., an X, Y, Z positioner to control the position of the chuck apparatus in the X, Y and Z directions of FIGS. 1-3). As an example, the chuck positioner apparatus 150 can include linear or rotary servos, positioner actuators and mechanical supporting structures to move the chuck apparatus 101 to any position and orientation in a three dimensional space. The test system 100 also includes a contactor 152 with conductive probes 153 to connect to the lands or other conductive features 142 of the DUT 140, and an electronic test circuit 154 connected to the contactor 152 to test the DUT 140. In operation, the positioner apparatus 150 engages and picks up a packaged device 140 from a tray, transports the device 140 to a test contactor 152 to engage the conductive lands 142 of the DUT 140 to the probes 153 (e.g., needles) or other conductive features of the test contactor 152.

After testing, the positioner apparatus 150 transfers the tested DUT 140 to a storage container or back to the original tray, and repeats the process to test another device 140. The engaged probe needles 153 electrically connect one or more circuits of the DUT 140 to the test circuit 154 for automated device testing. A controller 156 controls operation of the test circuit 154 and the positioner apparatus 150. The test system 100 also includes a vacuum pump 158 operated by the controller 156 to implement vacuum engagement of the top side of the DUT 140 with the first (e.g., lower) end 107 of the nozzle 108. The first end 107 of the nozzle 108 is generally planar to engage the flat top surface of the DUT 140. The engagement surface 106 extends around the recess 104 to engage the tapered sidewall surface of the DUT 140.

The engagement of the clamp 103 and the DUT 140 ensures that the conductive lands 142 of the DUT 140 are spaced by a non-zero distance 160 from the clamp 103. The engagement surface 106 of the clamp 103 is positioned to ensure that the conductive lands 142 do not touch any part of the chuck for both minimum and maximum package tolerance dimensions. The engagement of the DUT 140 with the contactor 152 sets a distance 162 between the inner top of the clamp 103 and the top surface of the contactor 152. The engagement of the clamp 103 and the DUT 140 sets a distance 164 between the inner top of the clamp 103 and the first end 107 of the nozzle 108. The engagement force that engages the DUT 140 with the contactor 152 also sets a distance 166 of the spacing, if any, between the upper surface 125 of the pad 112 and the lower side 127 of the base 102.

Figure 5:
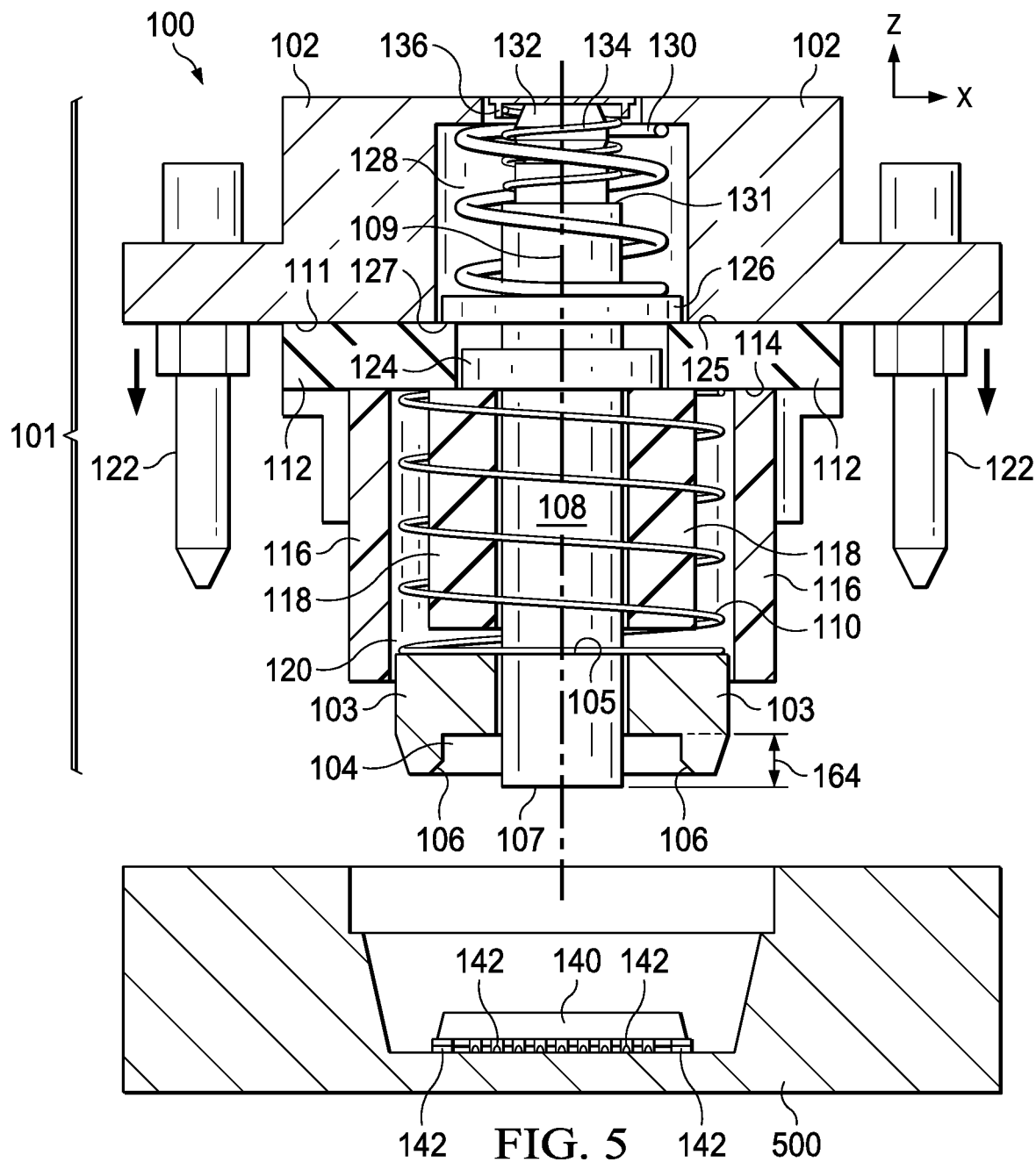
FIGS. 5-12 are partial sectional side elevation views of the chuck apparatus in different positions during electronic device testing.

Referring also to FIGS. 4-12, FIG. 4 shows an example electronic device test method 400 that can be implemented in the system 100 of FIG. 1, and FIGS. 5-12 show the example chuck apparatus 101 in different positions during electronic device testing according to the method 400. In one example, the controller 156 of the test system 100 implements the method 400 for each of a series of device testing cycles, beginning with the chuck apparatus 101 positioned over a next device 140 to be tested as shown in FIG. 5. In this example, the device 140 is located in a recessed area of a carrier tray 500. The downward force of the plate spring 130 seats the lower side 127 of the plate 126 on the upper surface 125 of the pad 112, and the distance 164 between the inner top of the clamp 103 and the first end 107 of the nozzle 108 is at its maximum. The method 400 includes activating the vacuum pump at 402 (e.g., 158 in FIG. 1) to create vacuum pressure at the first end 107 of the nozzle 108.

Figure 6:
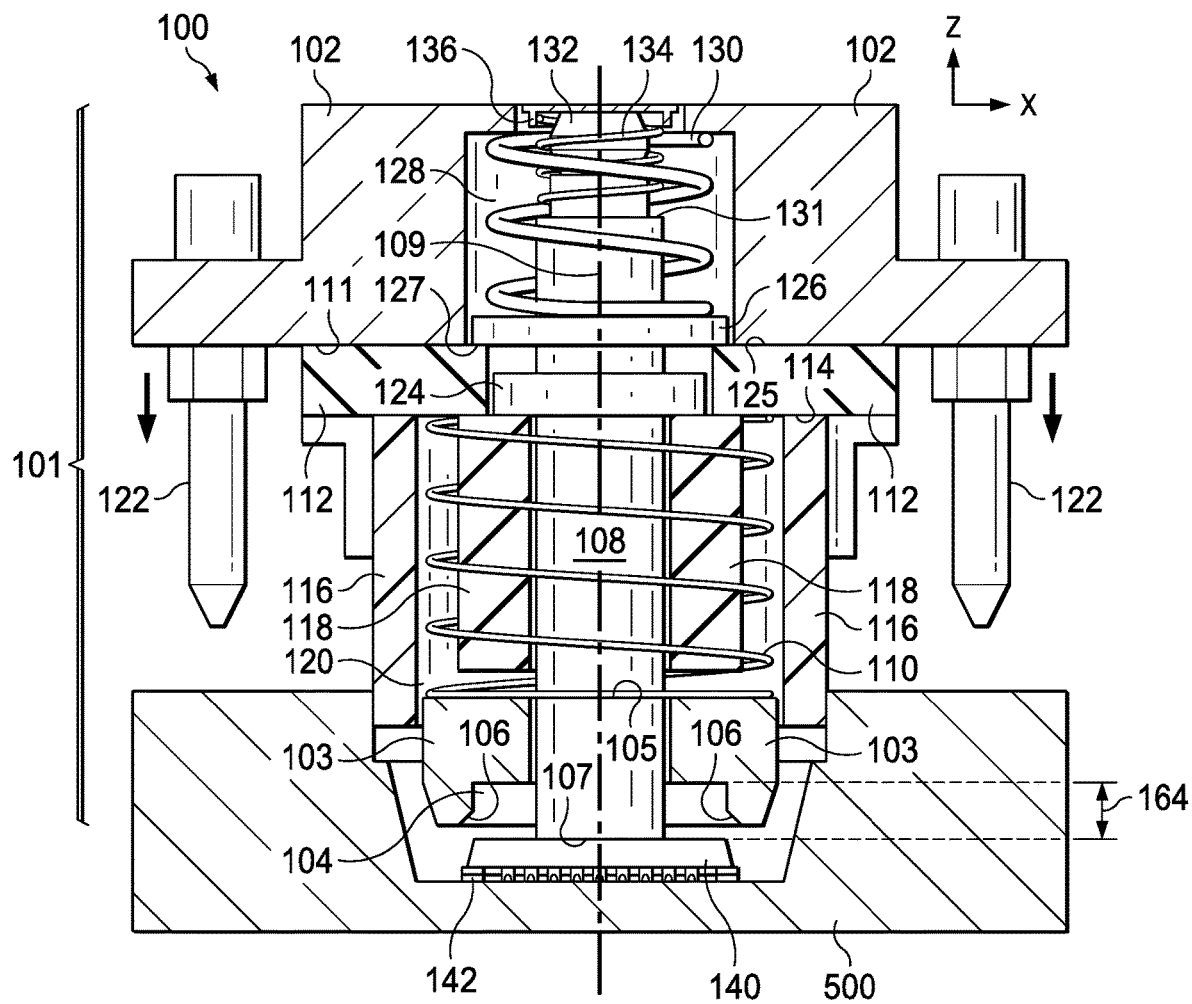
Figure 7:
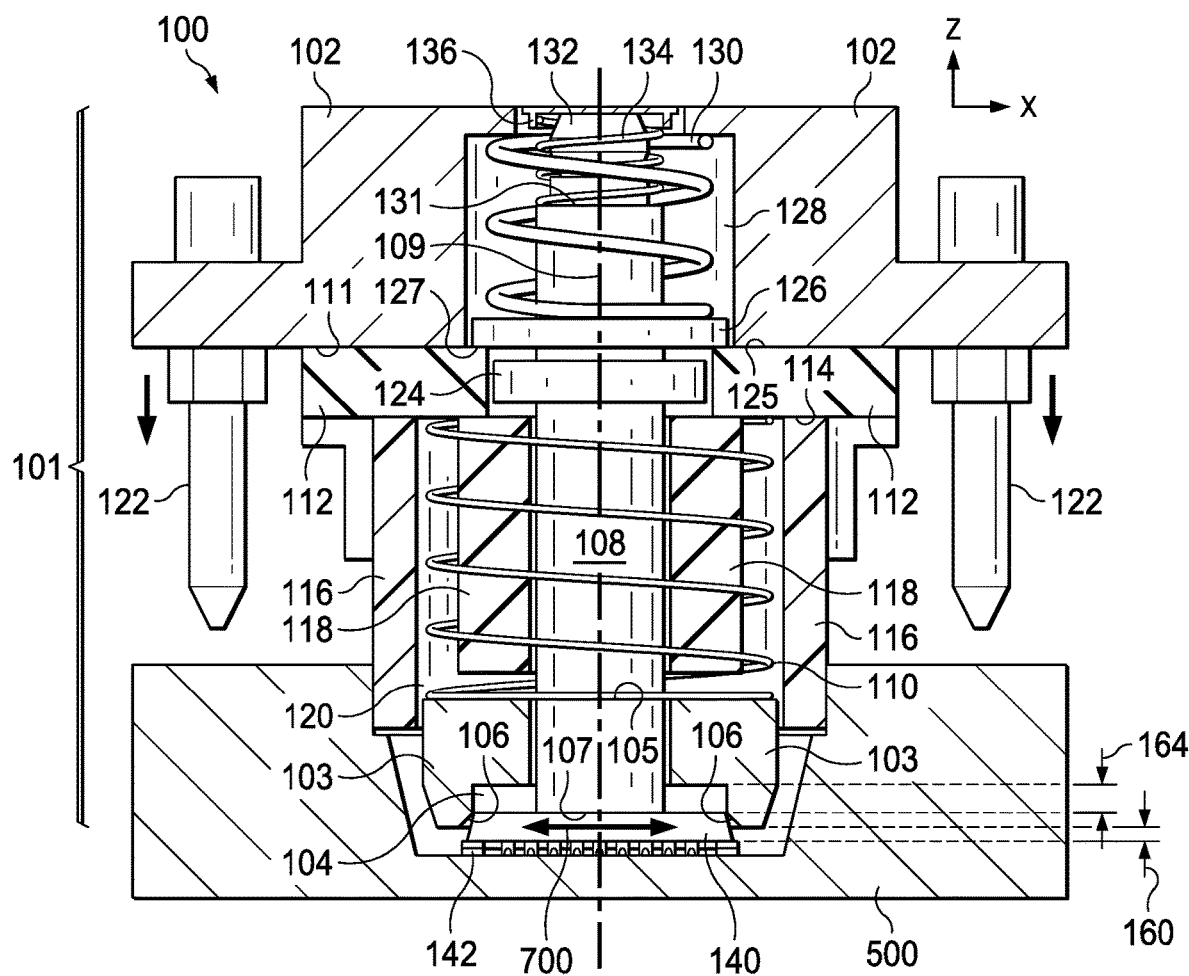

The method 400 also includes translating the chuck apparatus 101 downward at 404 to engage a bottom nozzle end 107 with a device under test DUT 140. FIG. 6 shows the example chuck apparatus 101 translating downward toward the carrier tray 500 with the planar first end 107 of the nozzle 108 first touching the planar top side of the DUT 140, where the distance 164 between the inner top of the clamp 103 and the first end 107 of the nozzle 108 remains at its maximum. The method 400 includes further translating the chuck apparatus 101 downward at 406 to engage and self-align the engagement surface 106 of the spring mounted clamp 103 with a sidewall of the DUT 140. In one example, the self-alignment is lateral, although not a strict requirement of all possible implementations. FIG. 7 shows further downward translation of the chuck apparatus 101. This reduces the spacing between the upper surface of the flange 124 and the lower surface 127 of the plate 126. The engagement of the engagement surface 106 with the sidewall of the DUT 140 in combination with the continued downward chuck translation causes lateral self-alignment of the DUT in the lateral (e.g., the X-Y) plane, shown as the lateral direction 700 in FIG. 7. The downward translation at 406 also slightly reduces the distance 164 between the inner top of the clamp 103 and the first end 107 of the nozzle 108 as shown in FIG. 7.

Figure 8:
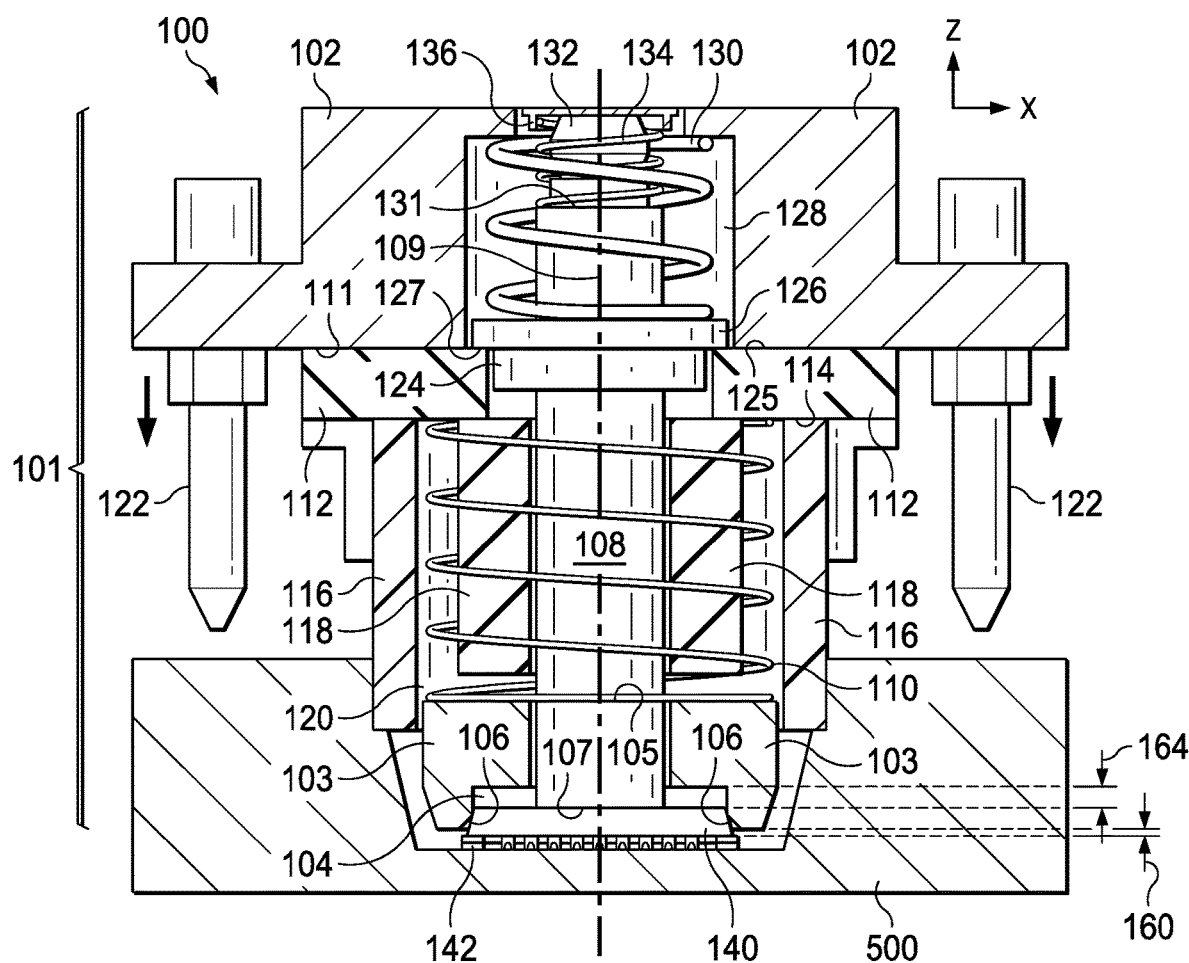
Figure 9:
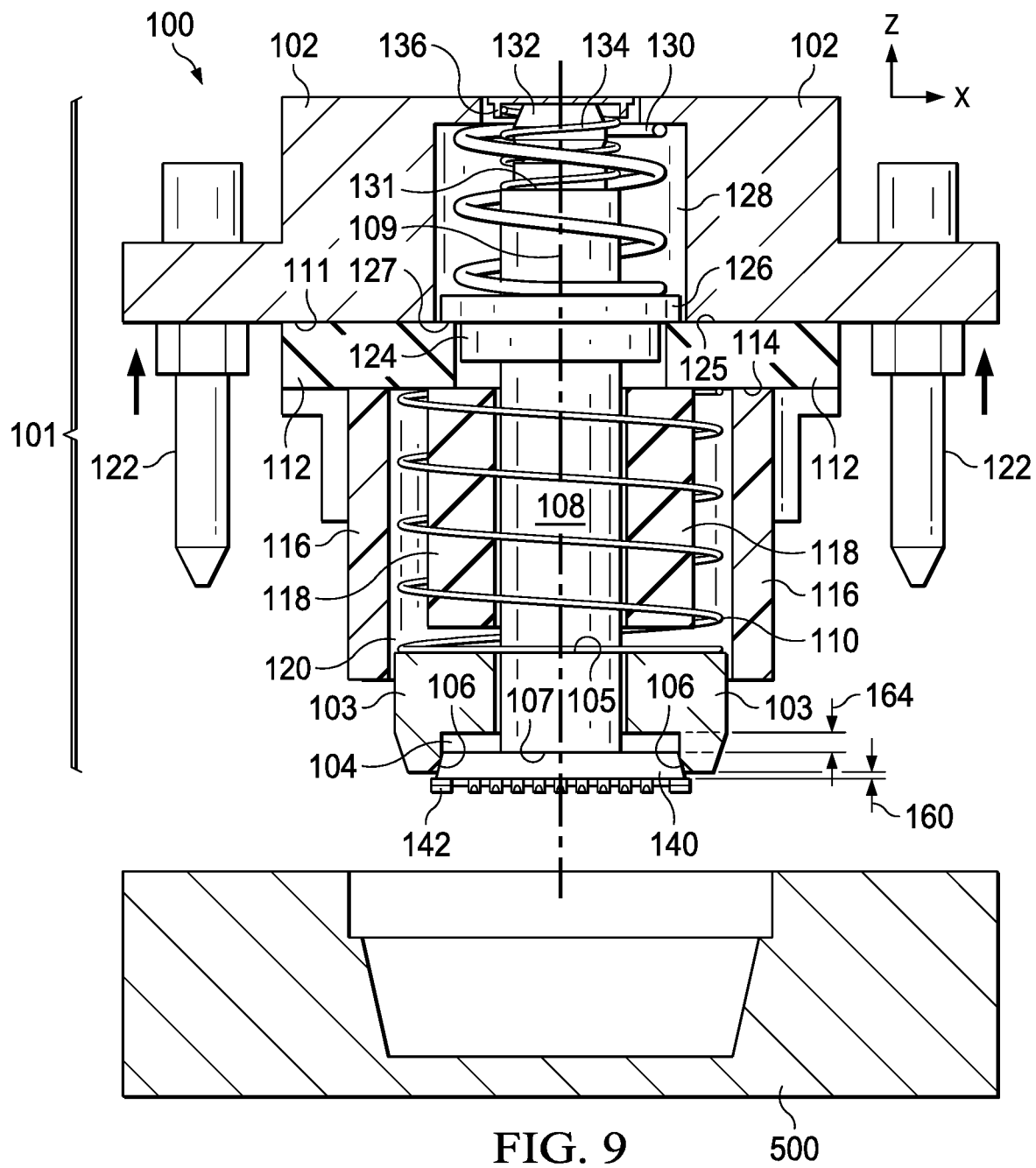
Figure 10:
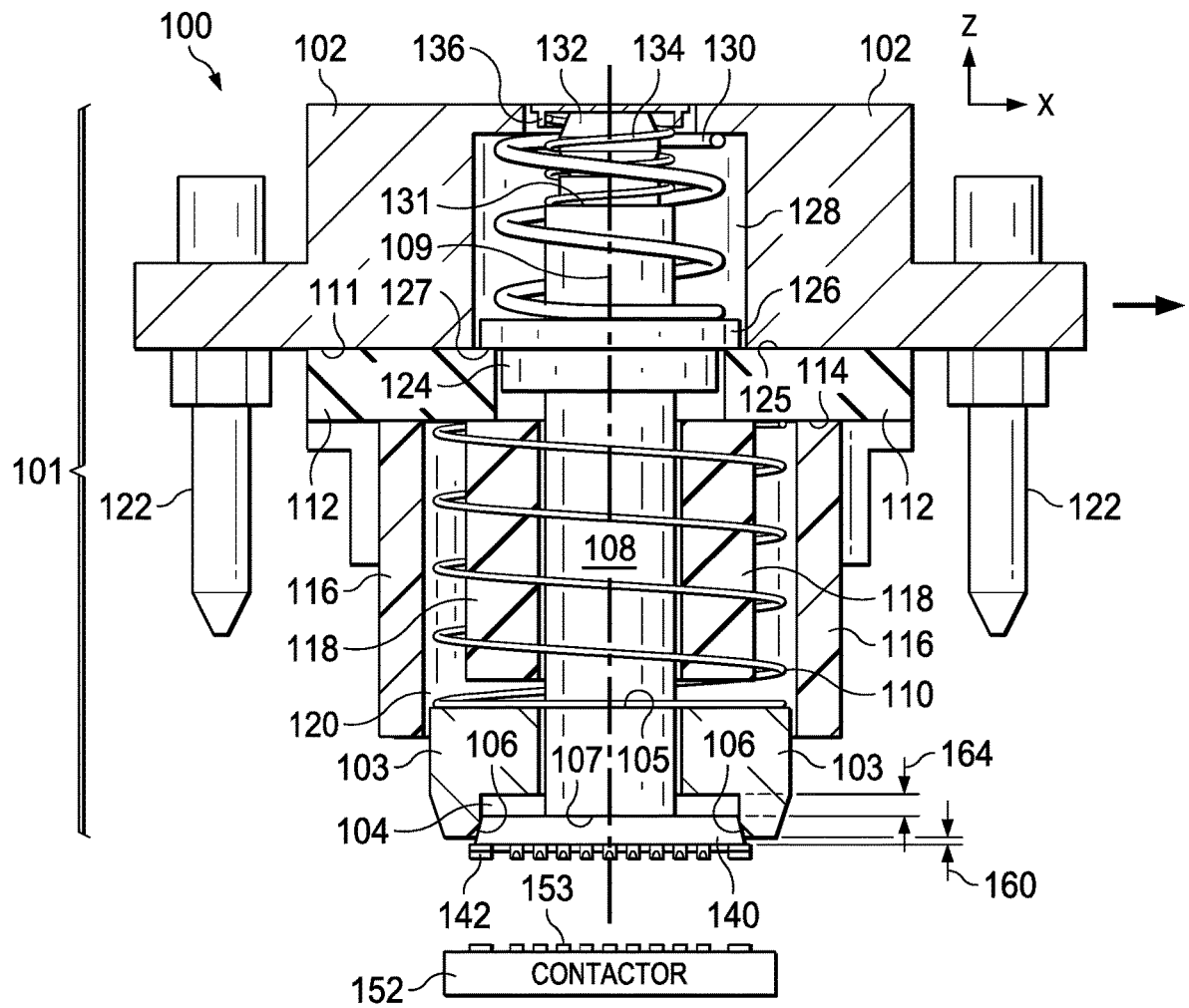
Figure 11:
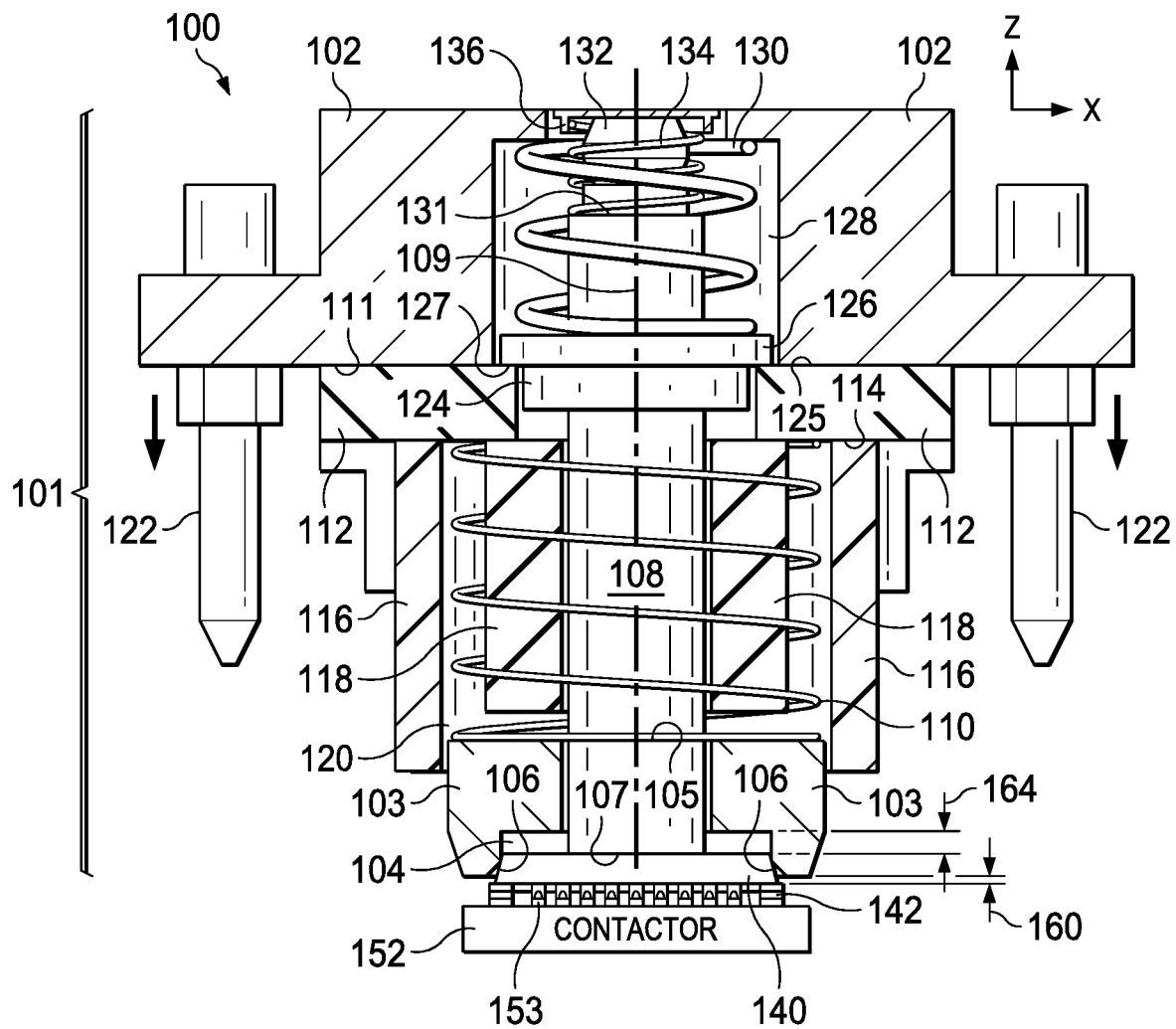
Figure 12:
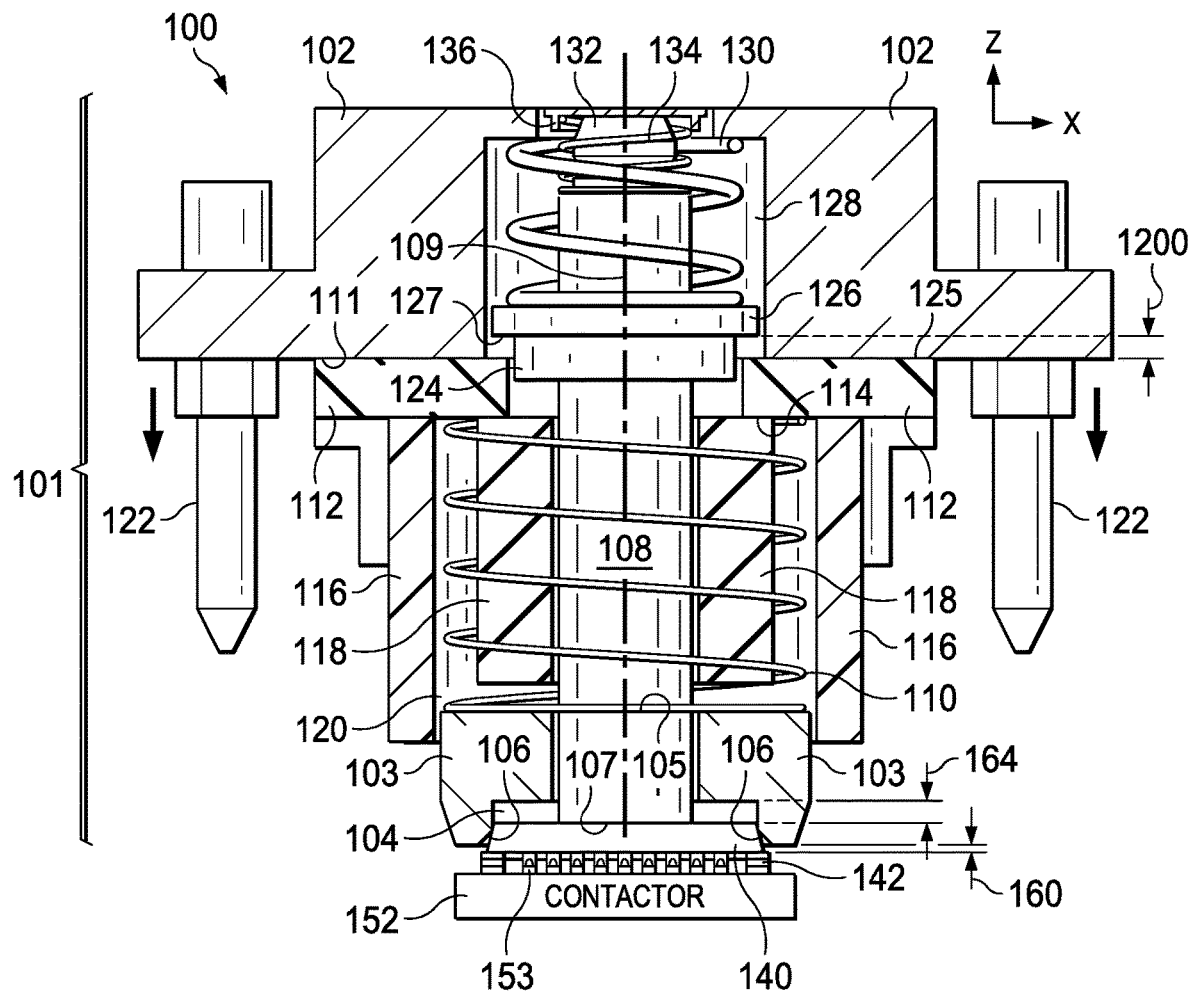

The method 400 continues at 408 with further translating the chuck apparatus 101 downward to seat the sidewall of the DUT 140 in the spring mounted clamp 103. FIG. 8 shows an example where the vacuum force attaches the upper side of the DUT 140 to the lower first side 107 of the nozzle, and the tapered sidewall of the punch QFN DUT 140 is seated in clamp 103 by friction contact with the clamp engagement surface 106. In the illustrated example, the further downward translation of the chuck apparatus 101 engages the upper surface of the flange 124 with the lower surface 127 of the plate 126, although not a strict requirement of all possible implementations. With the DUT 140 engaged and seated in the clamp 103, the positioner apparatus 150 translates the chuck apparatus 101 at 410 with the DUT 140 laterally to the contactor 152. FIG. 9 shows the upward translation of the chuck apparatus 101 and the seated DUT 140 away from the carrier tray 500. FIG. 10 shows lateral translation of the chuck apparatus 101 and the DUT 140 to a position above the test contactor 152. At 412, the positioner apparatus 150 translates the chuck apparatus 101 with the DUT 140 downward to engage the conductive features 142 of the DUT 140 with the conductive probes 153 of the contactor 152. FIG. 11 shows initial downward translation that contacts the conductive probes 153 to the conductive lands 142 of the DUT 140. As shown in FIG. 12, the positioner apparatus 150 further translates the chuck apparatus 101 downward, which causes the flange 124 to push the plate upward by a distance 1200 above the top surface 125 of the pad 112 against the bias of the plate spring 130.

Modifications are possible in the described embodiments, and other embodiments are possible, within the scope of the claims.

The following is claimed:

1. A chuck apparatus, comprising:
a nozzle extending along an axis between a first end configured to engage a device under test (DUT), and a second end;
a clamp extending around a portion of the nozzle proximate the first end, the clamp including:
a recess to receive the DUT, and
an engagement surface in the recess to engage a sidewall of the DUT; and
a clamp spring biasing a surface of the clamp toward the first end of the nozzle.

2. The chuck apparatus of claim 1, wherein the first end of the nozzle is generally planar to engage a flat top surface of the DUT, and wherein the engagement surface of the clamp extends around the recess to engage a tapered surface of the DUT.

3. The chuck apparatus of claim 1, wherein the clamp spring is positioned between a base and the surface of the clamp to bias the clamp toward the first end of the nozzle.

4. The chuck apparatus of claim 3, further comprising a pad mounted to a surface of the base;
wherein the clamp spring includes a first end engaging a bottom surface of the pad, and a second end engaging the surface of the clamp to bias the clamp toward the first end of the nozzle.

5. The chuck apparatus of claim 4, further comprising a clamp guide mounted to the bottom surface of the pad and extending around a portion of the clamp.

6. The chuck apparatus of claim 4,
wherein the nozzle includes a flange; and
wherein the chuck apparatus further comprises:
a plate extending around a portion of the nozzle in an opening of the base, above the flange, and
a plate spring positioned between an upper surface of the plate and an upper surface of the opening of the base to bias the plate toward the flange.

7. The chuck apparatus of claim 6,
wherein the nozzle is movable along the axis in a first range in which the flange is spaced from the plate and the plate is in contact with an upper surface of the pad; and
wherein the nozzle is movable along the axis in a second range in which the flange is in contact with the plate and the plate is in contact with or spaced from the upper surface of the pad.

8. The chuck apparatus of claim 3,
wherein the nozzle includes a flange; and
wherein the chuck apparatus further comprises:
a plate extending around a portion of the nozzle in an opening of the base, above the flange, and
a plate spring positioned between an upper surface of the plate and an upper surface of the opening of the base to bias the plate toward the flange.

9. The chuck apparatus of claim 8,
wherein the nozzle is movable along the axis in a first range in which the flange is spaced from the plate; and
wherein the nozzle is movable along the axis in a second range in which the flange is in contact with the plate.

10. A method, comprising:
translating a chuck downward to engage a bottom nozzle end with a device under test (DUT);
further translating the chuck downward to engage and self-align an engagement surface of a spring mounted clamp with a sidewall of the DUT;
further translating the chuck downward to seat the sidewall of the DUT in the spring mounted clamp;
translating the chuck with the DUT to a contactor; and
translating the chuck with the DUT downward to engage conductive features of the DUT with conductive probes of the contactor.

11. A system, comprising:
a contactor with conductive probes to connect to conductive features of a device under test (DUT);
an electronic test circuit connected to the contactor to test the DUT; and
a chuck apparatus including:
a nozzle extending along an axis between a first end configured to engage the DUT, and a second end,
a clamp extending around a portion of the nozzle proximate the first end, the clamp including:
a recess to receive the DUT, and
an engagement surface in the recess to engage a sidewall of the DUT, and
a clamp spring biasing a surface of the clamp toward the first end of the nozzle.

12. The system of claim 11, wherein the first end of the nozzle is generally planar to engage a flat top surface of the DUT, and wherein the engagement surface of the clamp extends around the recess to engage a tapered surface of the DUT.

13. The system of claim 11, wherein the clamp spring is positioned between a base and the surface of the clamp to bias the clamp toward the first end of the nozzle.

14. The system of claim 13, further comprising a pad mounted to a surface of the base;
wherein the clamp spring includes a first end engaging a bottom surface of the pad, and a second end engaging the surface of the clamp to bias the clamp toward the first end of the nozzle.

15. The system of claim 14, further comprising a clamp guide mounted to the bottom surface of the pad and extending around a portion of the clamp.

16. The system of claim 14,
wherein the nozzle includes a flange; and
wherein the chuck apparatus further comprises:
a plate extending around a portion of the nozzle in an opening of the base, above the flange, and
a plate spring positioned between an upper surface of the plate and an upper surface of the opening of the base to bias the plate toward the flange.

17. The system of claim 16,
wherein the nozzle is movable along the axis in a first range in which the flange is spaced from the plate and the plate is in contact with an upper surface of the pad; and
wherein the nozzle is movable along the axis in a second range in which the flange is in contact with the plate and the plate is in contact with or spaced from the upper surface of the pad.

18. The system of claim 13,
wherein the nozzle includes a flange; and
wherein the chuck apparatus further comprises:
a plate extending around a portion of the nozzle in an opening of the base, above the flange, and
a plate spring positioned between an upper surface of the plate and an upper surface of the opening of the base to bias the plate toward the flange.

19. The system of claim 18,
wherein the nozzle is movable along the axis in a first range in which the flange is spaced from the plate; and
wherein the nozzle is movable along the axis in a second range in which the flange is in contact with the plate.

20. The system of claim 11, further comprising a positioner apparatus configured to:
translate the chuck apparatus downward to engage a bottom nozzle end with the DUT,
further translate the chuck apparatus downward to engage and self-align an engagement surface of a spring mounted clamp with a sidewall of the DUT,
further translate the chuck apparatus downward to seat the sidewall of the DUT in the spring mounted clamp,
translate the chuck apparatus with the DUT to a contactor, and
translate the chuck apparatus with the DUT downward to engage conductive features of the DUT with conductive probes of the contactor.

* * * * *